United States Patent

Yamanaka et al.

[11] Patent Number: 5,915,197
[45] Date of Patent: Jun. 22, 1999

[54] FABRICATION PROCESS FOR SEMICONDUCTOR DEVICE

[75] Inventors: Michiko Yamanaka; Naoharu Nishio, both of Tokyo, Japan

[73] Assignee: NEC Corporation, Tokyo, Japan

[21] Appl. No.: 08/736,784

[22] Filed: Oct. 25, 1996

Related U.S. Application Data

[63] Continuation of application No. 08/319,730, Oct. 7, 1994, abandoned.

[30] Foreign Application Priority Data

Oct. 7, 1993 [JP] Japan ................................ 5-251265

[51] Int. Cl.$^6$ ........................ H01L 21/28; H01L 21/335
[52] U.S. Cl. .................... 438/586; 438/655; 438/657; 438/665; 438/674; 438/683
[58] Field of Search .................... 438/586, 649, 438/655, 682, 683, 677, 657, 665, 674

[56] References Cited

U.S. PATENT DOCUMENTS

| 3,753,774 | 8/1973 | Velolic ................................ 437/200 |
| 4,458,410 | 7/1984 | Sugaki et al. ........................ 437/200 |
| 4,498,223 | 2/1985 | Goldman et al. ...................... 437/34 |
| 4,555,301 | 11/1985 | Gibson et al. ....................... 156/617 |
| 4,701,349 | 10/1987 | Koyanagi et al. ..................... 437/228 |
| 4,873,205 | 10/1989 | Critchlow et al. .................... 437/200 |
| 4,965,213 | 10/1990 | Blake ................................ 437/21 |
| 4,966,868 | 10/1990 | Murali et al. ....................... 437/193 |
| 5,344,793 | 9/1994 | Zeininger et al. .................... 437/200 |

FOREIGN PATENT DOCUMENTS

| 2-290018 | 11/1990 | Japan . |
| 3-46323 | 2/1991 | Japan . |
| 2214708 | 9/1989 | United Kingdom . |

OTHER PUBLICATIONS

Ishibashi, K., et al., "Formation of Uniform . . . ", Japanese J. Appl. Phys. Pt. 1, Aug. 1985, 24(8), 912–917.
Fathauer, R., et al., "Columnar Growth of . . . ", Thin Solid Film, vol. 184, Jan. 1990, pp. 335–342.
Wolf, S, Silicon Processing, vol. 2, 1990, Lattice Press, pp. 546–547, 67–76.
Hsia et al., J. Appl. Phys., vol. 70, No. 12, Dec. 15, 1991, p. 7580.
W. P. Maszara, Appl. Phys. Lett., vol. 62, No. 9, Mar. 1, 1993, p. 962.
Sumi et al., "New Silicidation Technology by SITOX (Silicidation Through Oxide) and Its Impact on Sub–half Micron MOS Devices", IEDM 90, pp. 249–252.

Primary Examiner—T. N. Quach
Attorney, Agent, or Firm—Sughrue, Mion, Zinn, Macpeak & Seas, PLLC

[57] ABSTRACT

A Fabrication process for a semiconductor device, in which an element separation region and a gate insulation layer are formed on a surface of a silicon layer of a semiconductor substrate. Then, a gate electrode wiring is formed on the surface of the silicon layer and an insulation layer spacer is formed at the side surface of the gate electrode wiring. Diffusion layers to be a source and drain regions are formed in a predetermined region on the surface of the silicon layer. At least the surface of the diffusion region is converted into an uneven surface. Then, a refractory metal (e.g. titanium layer) is deposited on the entire surface, a refractory metal silicide layer is selectively formed on at least one of the surfaces of the diffusion layers by annealing, and a non-reacted refractory metal layer is selectively removed. Thus, in advance of deposition of titanium layer, unevenness is formed on the exposed surfaces of the diffusion layers and the upper surface of the polycrystalline silicon layer. This allows a MOS transistor of the salicide structure to be formed without increasing sheet resistance even when high temperature annealing is performed.

10 Claims, 3 Drawing Sheets

FIG. I
(PRIOR ART)
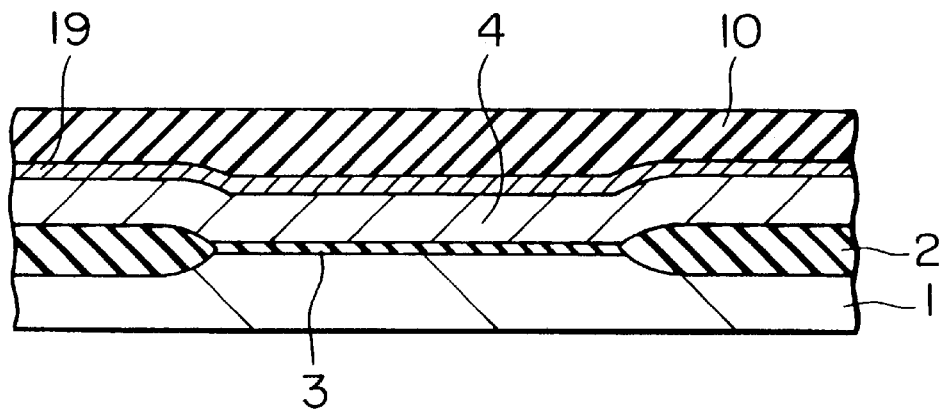
FIG. 2
(PRIOR ART)
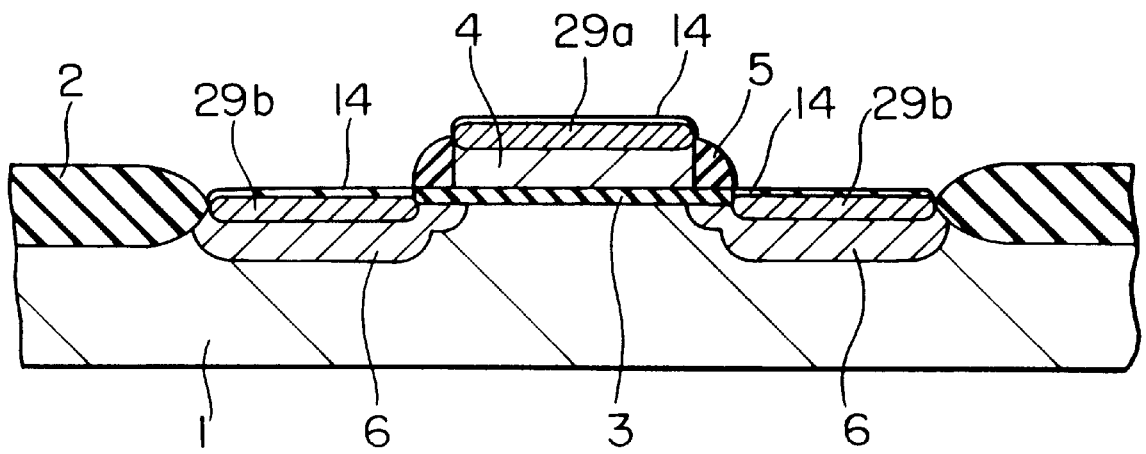

FABRICATION PROCESS FOR SEMICONDUCTOR DEVICE

This is a continuation of application Ser. No. 08/319,730 filed Oct. 7, 1994, abandoned.

BACKGROUND OF THE INVENTION

1. Field of the Invention

The present invention relates generally to a fabrication process for a semiconductor device. More specifically, the invention relates to a fabrication process for a MOS transistor of a salicide (self-aligned silicide) structure.

2. Description of the Related Art

Among refractory metal silicides, titanium silicide and cobalt silicide are known to have small electric resistivity and excellent heat-resistant property. Therefore, titanium silicide, for example, has been attracting attention as high heat-resistant material to be typically used in semiconductor devices. However, upon formation of a titanium silicide layer, it has been known that such titanium silicide layer tends to be highly electrically resistive by annealing at a temperature higher than or equal to 800° C. after formation of the layer. Therefore, when titanium silicide is used for a semiconductor device, the condition applicable in fabrication process becomes quite severe. This drawback is common to various refractory metal silicides.

Japanese Unexamined Patent Publication (Kokai) No. Heisei 2-290018 proposes one solution for such drawbacks. Referring to FIG. 1 which shows a section of a semiconductor device, a fabrication process of the semiconductor device (hereinafter referred to as first conventional process) disclosed in the above-identified publication is as follow.

At first, in a known process, field oxide layer 2 and a gate oxide layer 3 are formed on a surface of a silicon substrate 1. Then, by reduced pressure CVD method, a polycrystalline silicon layer is deposited over the entire surface. By thermal diffusion of phosphorus, a conductive polycrystalline silicon layer 4 is formed. Subsequently, by way of sputtering, a titanium silicide layer 19 is deposited over the entire surface. Furthermore, by known lithographic technology and/or dry-etching technology, patterning is performed for the titanium silicide layer 19 and the polycrystalline silicon layer 4 to form a gate electrode wiring of a polycide structure of laminated layer of the polycrystalline silicon layer 4 and the titanium silicide 19. After forming a diffusion layer to be a source region and a drain region of a MOS transistor by ion implantation, an interlayer insulation layer 10 is deposited over the entire periphery. Then, under pyrogenic oxidation atmosphere, annealing is performed to lower the resistance of the gate electrode wiring and to activate the diffusion layer forming the source and drain regions. This annealing under the pyrogenic oxidation atmosphere, degradation of morphology of the refractory metal silicide and agglomeration of the refractory metal silicide can be suppressed.

On the other hand, Japanese Unexamined Patent Publication No. Heisei 3-46323 discloses a thermal process for overcoming the foregoing drawback. The fabrication process (hereinafter referred to as second conventional process) for the semiconductor device disclosed in the above-identified publication is as follow.

At first, the field oxide layer 2 and the gate oxide layer 3 are formed on the surface of the silicon substrate 1. After formation of the polycrystalline silicon layer forming the gate electrode wiring, an insulation layer spacer 5 is formed on the side surface of the polycrystalline silicon layer. Then, ion implantation of conductive impurity is performed to form diffusion layers 6 to be source and drain regions. Also, the polycrystalline silicon layer becomes the conductive polycrystalline silicon layer 4 by the ion implantation. After a titanium layer is deposited over the entire surface, annealing is performed under non-oxidation atmosphere to form titanium silicide layers 29a and 29b on the upper surface of the polycrystalline silicon layer 4 and the surface of the diffusion layer 6, respectively. After removing non-reacted titanium layer, annealing is again performed at a temperature range higher than or equal to 600° C. and lower than or equal to 1000° C., under oxygen atmosphere for a predetermined period. Thus, titanium oxide layer 14 is formed on the surfaces of the titanium silicide layers 29a and 29b. By this second annealing, agglomeration of the titanium silicide layers 29a and 29b can be suppressed.

Agglomeration of the refractory metal silicide at a high temperature has been explained by surface energy of the refractory metal silicide, grain boundary energy, and interface energy between the refractory metal silicide and silicide of the substrate and so forth. Depending upon the grain size of the refractory metal silicide and surface orientation of the silicon substrate, crystal grain becomes easily deformed to easily cause agglomeration. In terms of prevention of agglomeration, the first and second conventional processes may be effective to a certain extent. However, in the foregoing first and second conventional processes, when annealing is performed at a temperature in the order of 800 to 1000° C., at which reflow of the interlayer insulation layer formed of BPSG layer occurs agglomeration can be caused. Therefore, suppression of agglomeration is limited and lowering of resistance becomes insufficient. Also, in the above-mentioned first conventional process, it is not possible to form a MOS transistor in a salicide structure. On the other hand, in the above-mentioned second conventional process, because of subjecting to second annealing, the process becomes not applicable in the case where the depth of binding of the diffusion layer becomes small due to reduction of the size of the semiconductor device.

SUMMARY OF THE INVENTION

It is an object of the present invention to provide a fabrication process adapted to down-sizing in fabrication of MOS transistor of a salicide structure.

Another object of the invention is to provide a fabrication process eliminating deformation and agglomeration of grain of a refractory metal silicide and certainly lower resistance of the refractory metal silicide.

According to the present invention, there is provided a fabrication process for semiconductor device comprising the steps of: forming a diffusion layer on the surface of said silicon layer; converting a surface of said diffusion layer into a surface having unevenness; depositing refractory metal; and forming a refractory metal silicide layer by annealing.

Agglomeration of refractory metal silicide is caused due to deformation of grain in a direction, at which the surface free energy of the grain becomes minimum. Therefore, when the refractory silicide layer is formed into a thin film, large grain becomes flat to easily cause agglomeration. When the surface of silicon is {111} surface, the interface energy between the refractory silicide layer and the silicon becomes more stable in comparison with the case where the surface of the silicon is formed by other surface, such as {100} surface, and thus deformation of grain can be easily prevented.

According to the present invention, before depositing refractory metal layer, unevenness, the primary exposed surface of which being {111} surface, is formed on the silicon layer as the substrate, morphology of the deposited refractory metal may not be directly influenced by orientation and grain size of the crystal of the substrate silicon layer. Namely, by the presence of unevenness, continuity of the orientation and grain size from the substrate silicon layer to the refractory metal layer (and refractory metal silicide layer) is broken. Since the primary exposed surface of this unevenness is {111} surface, when the refractory metal silicide layer is formed and then it is heat treated, growth of the crystal grain (grain growth) of the refractory metal silicide layer and continuity of variation of crystal structure associated with phase transition are limited within the size of the unevenness. Therefore, agglomeration can be restricted. By setting the size of the unevenness to be sufficiently smaller than the grain size of the conductive polycrystalline silicon layer, for example, this effect will become more remarkable.

BRIEF DESCRIPTION OF THE DRAWINGS

The present invention will be understood more fully from the detailed description given hereinbelow and from the accompanying drawings of the preferred embodiment of the present invention, which, however, should not be taken to be limitative to the invention, but are for explanation and understanding only.

In the drawings:

FIG. 1 is a section of the conventional semiconductor device;

FIG. 2 is a section of another conventional semiconductor device;

DETAILED DESCRIPTION OF THE PREFERRED EMBODIMENTS

The preferred embodiments of the present invention will be discussed in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessarily obscure the present invention.

FIGS. 3A to 3F represent sections at various process steps of the semiconductor fabrication process according to the present invention. The first embodiment is directed to a fabrication process of a MOS transistor of salicide structure formed on a surface of a single crystal silicon substrate having {100} surface orientation and employing titanium as refractory metal. This MOS transistor is fabricated through the following processes.

Figure 3A:
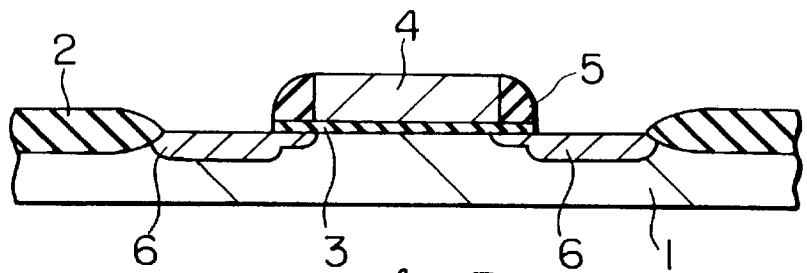
FIGS. 3A to 3F are sections showing process steps in the first embodiment of semiconductor device fabrication process according to the present invention.

At first, as shown in FIG. 3A, a field oxide layer 2 is selectively formed in an element separating region on the surface of the silicon substrate 1 formed of a single crystal silicon having {100} surface orientation. On an element forming region on the surface of the substrate 1, a gate oxide layer 3 is formed. A polycrystalline silicon layer is deposited over the entire surface. Then, by the known process, the polycrystalline silicon layer is patterned. Thus, a part of the polycrystalline silicon layer remains at the portion where the gate electrode wiring is formed. Then, low concentration ion implantation is performed to form a part of a diffusion layer. After depositing an insulation later over the entire surface, an anisotropic etching is performed for the insulation layer to form an insulation layer spacer 5. Then, high concentration ion implantation is performed to convert the remains polycrystalline silicon layer into a conductive polycrystalline silicon layer 4. Also, LDD type diffusion layers 6 to be the source and drain regions are formed on the surface of the silicon substrate.

Figure 3B:
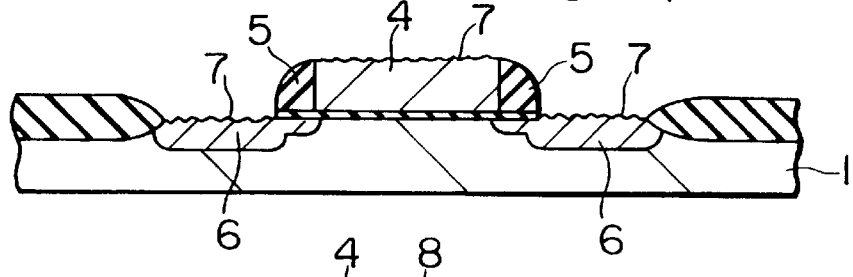

Next, as shown in FIG. 3B, unevenness 7 having a desired size is formed on the exposed surface of the diffusion layer 6 and on the upper surface of the polycrystalline silicon layer 4. The method for forming the unevenness 7 is as follows. The first forming method is a method including a selective growth of amorphous silicon. At first, for example, amorphous silicon is deposited on the exposed surface of the diffusion layers 6 and the upper surface of the polycrystalline silicon layer 4 by way of CVD method with silane or disilane as growth gas at a flow rate of 500 sccm and hydrogen, nitrogen or helium gas as carrier gas at a flow rate of 500 sccm under a temperature of 500° C. and pressure of 40 Pa. Subsequently, annealing is performed at 800° C. for 30 minutes to convert the amorphous silicon into a polycrystalline silicon with the unevenness 7, the primary exposed surface of which being {111} surface.

The second forming method is a selective growth method of polycrystalline silicon. By selectively growing polycrystalline silicon directly on the exposed surface of the diffusion layer 6 and the upper surface of the polycrystalline silicon layer 4, unevenness 7 of polycrystalline silicon with the {111} surface as the exposed surface can be formed.

The third method is a selective growth of HSG (Hemi-Spherical Grain) polycrystalline silicon. In this method, at first, within a growth device which permits UHV (Ultra-High Vacuum) CVD method, naturally oxidized layers on the exposed surface of the diffusion layer 6 and the upper surface of the polycrystalline silicon layer 4 are removed. Then, in the growth device, amorphous silicon is selectively deposited on the exposed surface of the diffusion layer 6 and the upper surface of the polycrystalline silicon layer 4 under a temperature of about 510° C. Subsequently, by elevating the temperature in the growth device to a temperature of about 600° C., and supplying disilane gas at a flow rate of 13 cc/min. for several tens seconds, HSG polycrystalline silicon layer is formed. The exposed surface of this HSG polycrystalline silicon layer is almost consisted of almost {111} surface. It should be noted that, in the first and second forming method, it is desirable that a certain amount of naturally oxidized layer remains on the exposed surface of the diffusion layer 6 and the upper surface of the polycrystalline silicon layer 4 before deposition of amorphous silicon or polycrystalline silicon.

Figure 3C:
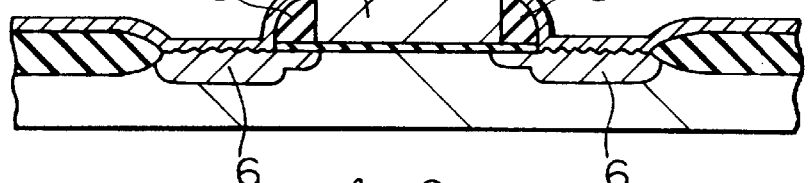

Next, as shown in FIG. 3C, a given thickness of titanium layer 8 is sputtered over the entire surface. The sputtering condition is 1.1 Pa of pressure and 1 kW of RF power. In the shown embodiment, the value of the thickness of the titanium layer 8 is determined on the basis of the binding depth of the diffusion layer 6 and a sheet resistance required for a titanium silicide layer. On the other hand, in the foregoing conventional method 2, when the semiconductor device is down-sized and thus the binding depth of the diffusion layer becomes smaller, it becomes difficult to make the layer thickness of the titanium layer thicker than that of the shown embodiment of the titanium layer. Therefore, the sheet resistance of the titanium silicide layer becomes large.

Figure 3D:
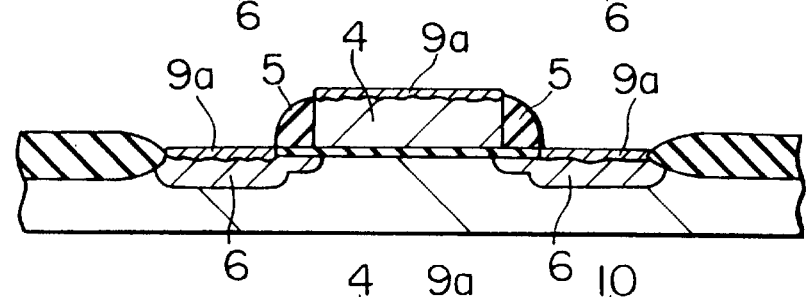

Next, as shown in FIG. 3D, the first RTA (Rapid Thermal Annealing) process is performed under a nitrogen atmosphere at a temperature of 600° C., for about 30 seconds. Then, only titanium layer 8 deposited on the upper surface of the polycrystalline silicon layer 4 and the exposed surface of the diffusion layer 6 can be selectively converted into titanium silicide layers 9a and 9b. At this time (while not illustrated on the drawing), on the surface of the non-reacted titanium layer 8 and titanium silicide layers 9a and 9b, a titanium nitrogen layer is formed. At this stage, titanium silicide layer 9a and 9b are in semi-stable crystal structure and thus has the crystal structure consisted of $C_{49}$ type space group. The space group in the crystal structure of stable phase of titanium silicide is $C_{54}$ type space group. The sheet resistance of the $C_{49}$ type titanium silicide has been known to be larger than the sheet resistance of the $C_{54}$ type titanium silicide. Titanium nitride layer and non-reacted titanium layer 8 are removed by RIE (Reactive Ion Etching).

Subsequently, the second RTA process is performed at 850° C. for about 2 seconds. By this second RTA process, the titanium silicide layers 9a and 9b are converted into a stable crystal structure, the space group of which is in $C_{54}$ type, and reduced the resistance. It should be noted that, in the shown embodiment, in the processes of deposition of titanium layer 8 and first and second RTA process, the substrate for the titanium layer 8 and titanium silicide layers 9a and 9b consisted of the uneven surface 7 having a desired size of the polysilicon. Since the primary exposed uneven surface of the 7 is formed of {111} surface with mostly high density of silicon, grain growth of titanium layer 8 and titanium silicide layers 9a and 9b is restricted within the size of the unevenness 7.

Figure 3E:
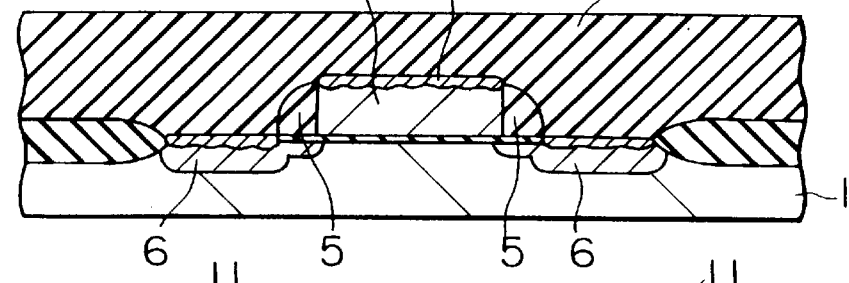

Next, as shown in FIG. 3E, an interlayer insulation layer 10 of BPSG layer is deposited over the entire surface. The interlayer insulation layer 10 is reflow at a temperature higher than or equal to 800° C. and lower than or equal to 1000° C. In the first and second conventional method set forth above, agglomeration is caused during the reflow step. This is because since the titanium silicide layer is directly formed on the conductive polycrystalline silicon layer (and on the diffusion layer), the crystal grain of titanium silicide layer is transferred large grain diameter of the crystal grain of the polycrystalline silicon layer (and crystal grain of the single crystal silicon). In contrast to this, in the shown embodiment, since the grain growth is restricted within the unevenness 7, agglomeration titanium silicide is never caused even in the reflow step.

Figure 3F:
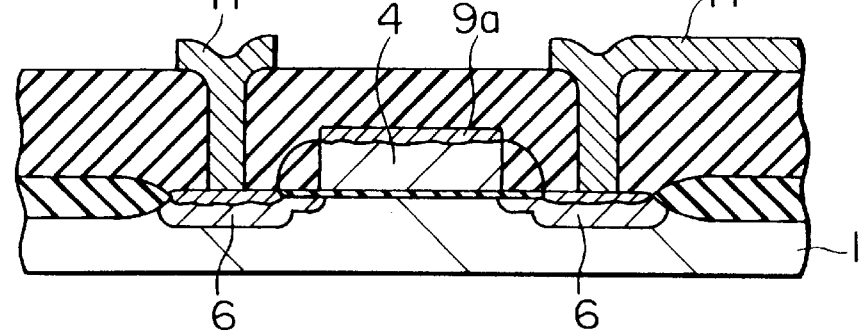

Next, as shown in FIG. 3F, a contact hole reaching to the diffusion layer 6 and so forth is formed through the interlayer insulation layer 10. Also, a metal wiring connected to the diffusion layer 6 and so forth through the contact hole is formed. Thus, the MOS transistor having salicide structure with the gate electrode wiring of polycide structure is completed.

It should be appreciated that the foregoing first embodiment is applicable for N-channel type and P-channel type MOS transistors. Also, while the shown embodiment of MOS transistor is formed on the surface of the single crystal silicon substrate, the shown embodiment is equally applicable for MOSFET type TFT (Thin Film Transistor). Furthermore, the shown embodiment is further applicable for the MOS transistor having refractory metal gate electrode wiring in place of the gate electrode wiring of polycide structure.

The second embodiment of the semiconductor fabrication process according to the present invention will be discussed with reference to FIGS. 4A to 4D which are sections showing fabrication processes for semiconductor devices. The shown embodiment is directed to a fabrication process for MOS transistor formed on single crystal silicon substrate of {100} surface orientation and having salicide structure employing cobalt as refractory metal.

Figure 4A:
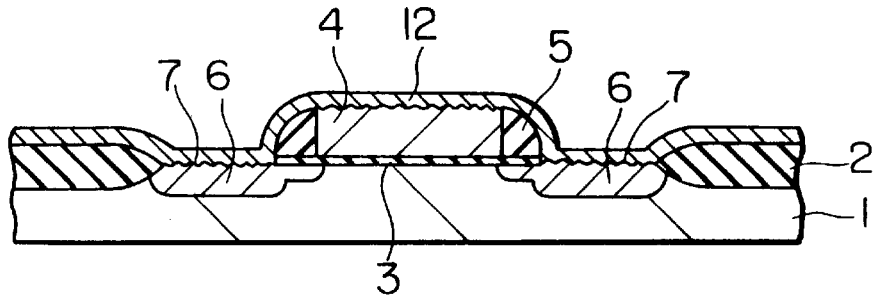
FIGS. 4A to 4D are sections showing process steps in the second embodiment of semiconductor device fabrication process according to the present invention.

Initially, processes which are same as those up to FIG. 3B are performed in the same manner as described with respect to the foregoing first embodiment. Next, as shown in FIG. 4A, a predetermined thickness of cobalt layer 12 is deposited over the entire surface by way of sputtering or so forth. When sputtering is employed, the sputtering condition is substantially the same as those of the first embodiment.

Figure 4B:
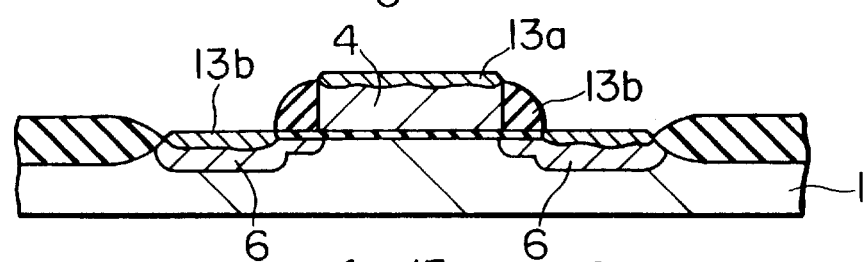

Then, as shown in FIG. 4B, first RTA process is performed under 600° C. nitrogen atmosphere for about 15 seconds. Thus, cobalt silicide layers 13a and 13b are formed. At this stage, cobalt silicide layers 13a and 13b are semi-stable $Co_2Si$ which has greater sheet resistance than stable phase $CoSi_2$. Thereafter, cobalt nitride layer and non-reacted cobalt layer 12 are removed by RIE. Subsequently, second RTA process is performed at a temperature of 850° C. for about 5 seconds. Thus, cobalt silicide layers 13a and 13b are converted into stable phase $CoSi_2$ and thereby lowering the resistances thereof.

Figure 4C:
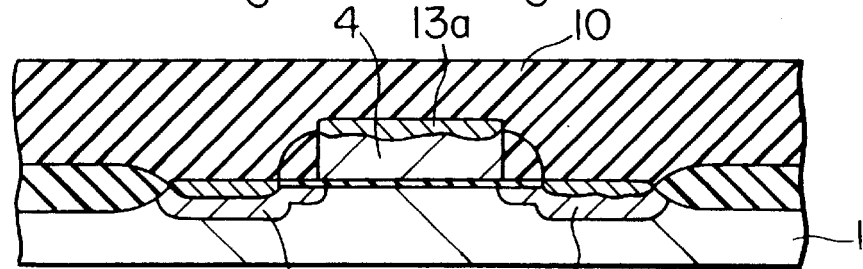

Next, as shown in FIG. 4C, interlayer insulation layer 10 of BPSG layer is deposited over the entire surface. The interlayer insulation layer 10 is then subject to a reflow process at a temperature higher than or equal to 800° C. and lower than or equal to 1000° C. Even in this embodiment, agglomeration of cobalt silicide 13a and 13b is never caused in the reflow process.

Figure 4D:
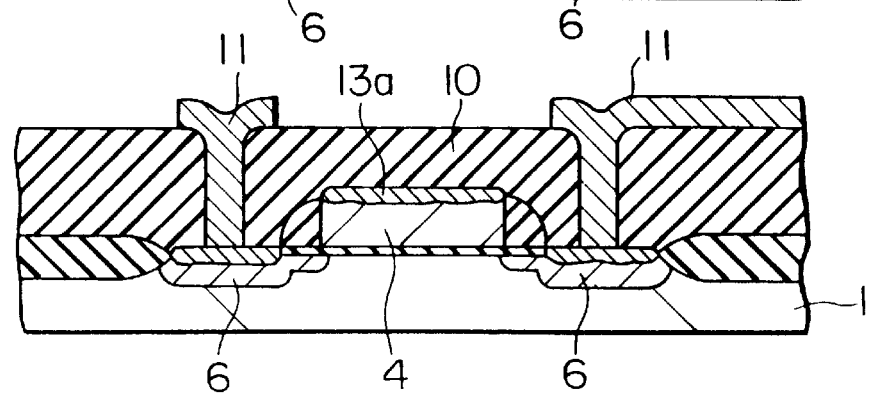

Subsequently, as shown in FIG. 4D, a contact hole reaching to the diffusion layer 6 and so forth is formed through the interlayer insulation layer 10. Furthermore, a metal wiring connected to the diffusion layer 6 or so forth through the contact hole is formed to complete the MOS transistor with salicide structure.

In the second embodiment set forth above, since mismatching between cobalt silicide and silicon is small, i.e. 1.2%, growth of cobalt silicide on the silicon of {111} surface is epitaxial growth. Therefore, elimination of agglomeration in the shown embodiment becomes better than that in the first embodiment.

It should be appreciated that the foregoing first embodiment is applicable for N-channel type and P-channel type MOS transistors. Also, while the shown embodiment of MOS transistor is formed on the surface of the single crystal silicon substrate, the shown embodiment is equally applicable for MOSFET type TFT (Thin Film Transistor). Furthermore, the shown embodiment is further applicable for the MOS transistor having refractory metal gate electrode wiring in place of the gate electrode wiring of polycide structure.

As set forth above, according to the present invention, it becomes possible to suppress increases of the sheet resistance associated with agglomeration of the refractory metal silicide layer and can certainly maintain the refractory metal silicide layer at a low resistance. Also, the present invention facilitates application in fabrication of the MOS transistor with salicide structure.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process for semiconductor device comprising the steps of:

forming a diffusion layer on the surface of a silicon layer;

converting a surface of said diffusion layer into an uneven surface having an unevenness of a predetermined size with primary exposed surface consisting of (111) surface;

depositing refractory metal onto at least said uneven surface; and forming through annealing a refractory metal suicide layer having a grain growth restricted by said predetermined size of said unevenness of said uneven surface, to eliminate deformation and agglomeration of grain of said refractory metal suicide layer and to produce a substantially lower resistance in said refractory metal silicide layer, wherein the step of converting the surface of said diffusion layer into the surface having the unevenness includes selectively depositing amorphous silicon or polycrystalline silicon at least on the surface of said diffusion layer.

2. A process as set forth in claim 1, wherein said refractory metal is titanium or cobalt.

3. A process as set forth in claim 1, wherein said silicon layer is a polycrystalline silicon layer, and said semiconductor substrate has a laminated structure of a single crystal silicon substrate, an insulation layer covering the surface of said single crystal silicon substrate and said polycrystalline silicon layer covering said insulation layer.

4. A fabrication process for semiconductor device comprising the steps of:

forming an element separation region and a gate insulation layer on a surface of a silicon layer which constitute at least a surface of a semiconductor substrate, forming a gate electrode wiring on the surface of said silicon layer and further forming an insulation layer spacer at the side surface of said gate electrode wiring;

forming diffusion layers to be source and drain regions in a predetermined region on the surface of said silicon layer;

converting at least the surfaces of said diffusion layers into uneven surfaces having an unevenness of a predetermined size with primary exposed surface consisting of (111) surface; and depositing refractory metal on at least the uneven surfaces;

selectively forming through annealing a refractory metal silicide layer having grain growth restricted by said predetermined unevenness of said uneven; and selectively removing non-reacted refractory metal layer, wherein formation of said refractory metal silicide layer on the uneven surfaces eliminates deformation and agglomeration of grain of said refractory metal silicide layer and produces said refractory metal silicide layer with a substantially lower resistance, and wherein the step of converting at least the surfaces of said diffusion layers into the surface having the unevenness includes selectively depositing amorphous silicon or polycrystalline silicon at least on the surfaces of said diffusion layers.

5. A process as set forth in claim 4, wherein said refractory metal is titanium or cobalt.

6. A process as set forth in claim 5, wherein said silicon layer has a predetermined surface orientation and is directly formed on another single crystal silicon layer having a same surface orientation as said predetermined surface orientation, said silicon layer and said another single crystal silicon layer constituting said semiconductor substrate.

7. A process as set forth in claim 5, wherein said silicon layer is a polycrystalline silicon layer, and said semiconductor substrate has a laminated structure of a single crystal silicon substrate, an insulation layer covering the surface of said single crystal silicon substrate and said polycrystalline silicon layer covering said insulation layer.

8. A process as set forth in claim 4, wherein said silicon layer is a single crystal silicon layer having a predetermined surface orientation and is directly formed on another single crystal silicon layer having a same surface orientation as said predetermined surface orientation, said silicon layer and said another single crystal silicon layer constituting said semiconductor substrate.

9. A process as set forth in claim 4, wherein said silicon layer has a predetermined surface orientation and is directly formed on another single crystal silicon layer having a same surface orientation as said predetermined surface orientation, said silicon layer and said another single crystal silicon layer constituting said semiconductor substrate.

10. A process as set forth in claim 4, wherein said silicon layer is a polycrystalline silicon layer, and said semiconductor substrate has a laminated structure of a single crystal silicon substrate, an insulation layer covering the surface of said single crystal silicon substrate and said polycrystalline silicon layer covering said insulation layer.

* * * * *

UNITED STATES PATENT AND TRADEMARK OFFICE
CERTIFICATE OF CORRECTION

PATENT NO. : 5,915,197
DATED : June 22, 1999
INVENTOR(S) : Michiko Yamanaka, et. al.

It is certified that error appears in the above-identified patent and that said Letters Patent is hereby corrected as shown below:

Column 4, line 4, delete "later" and insert --layer--.

Column 7, line 16, delete "suicide" and insert --silicide--.

Column 7, line 21, delete "suicide" and insert --silicide--.

Signed and Sealed this

Eighth Day of February, 2000

Attest:

Q. TODD DICKINSON

Attesting Officer

Commissioner of Patents and Trademarks